United States Patent
Xu et al.

(10) Patent No.: US 9,591,772 B2
(45) Date of Patent: Mar. 7, 2017

(54) DEVICE HOUSING WITH FASTENER NESTING PROVISION

(71) Applicant: Honeywell International Inc., Morristown, NJ (US)

(72) Inventors: Guobin Xu, Shenzhen (CN); Joe Lu, Shenzhen (CN); John M. Kovach, Shoreham, NY (US)

(73) Assignee: HONEYWELL INTERNATIONAL INC., Morristown, NJ (US)

( * ) Notice: Subject to any disclaimer, the term of this patent is extended or adjusted under 35 U.S.C. 154(b) by 45 days.

(21) Appl. No.: 14/330,300

(22) Filed: Jul. 14, 2014

(65) Prior Publication Data

US 2016/0014911 A1 Jan. 14, 2016

(51) Int. Cl.
 *H05K 5/00* (2006.01)
 *H05K 5/03* (2006.01)
 *H05K 5/02* (2006.01)
 *F16M 13/02* (2006.01)

(52) U.S. Cl.
 CPC ........... *H05K 5/0017* (2013.01); *F16M 13/02* (2013.01); *H05K 5/0204* (2013.01); *H05K 5/0217* (2013.01)

(58) Field of Classification Search
 CPC .. H05K 5/0026; H05K 5/0047; H05K 5/0017; H05K 5/0204; H05K 5/0004; H05K 7/14
 USPC ......................................... 174/535, 50, 520
 See application file for complete search history.

(56) References Cited

U.S. PATENT DOCUMENTS

| | | | |
|---|---|---|---|
| 3,822,783 A | 7/1974 | Mortensen | |
| 7,183,483 B1 | 2/2007 | Anderson et al. | |
| 7,531,744 B1 * | 5/2009 | Rohmer | H02G 3/20 174/54 |
| 7,654,784 B2 | 2/2010 | Daggers et al. | |
| 2007/0205011 A1 * | 9/2007 | Dinh | H02G 3/20 174/50 |
| 2007/0232112 A1 * | 10/2007 | Popa | H01H 13/70 439/331 |
| 2013/0063275 A1 | 3/2013 | Kucala | |

FOREIGN PATENT DOCUMENTS

| | | |
|---|---|---|
| CN | 1117684 C | 8/2003 |
| JP | 2001-69639 A | 3/2001 |
| JP | 2003-299224 A | 10/2003 |

OTHER PUBLICATIONS

English-language abstract of foreign patent CN 1117684C.
English-language abstract of foreign patent JP 2001-69639A.
(Continued)

*Primary Examiner* — Hoa C Nguyen
*Assistant Examiner* — Amol Patel
(74) *Attorney, Agent, or Firm* — Husch Blackwell LLP

(57) ABSTRACT

An electrical unit includes a mounting portion, which can define, in part, an interior region. The mounting portion includes a plurality of item clamping elements. The elements are displaced from one another to releasably support an item within the interior region. Items can be selected from a class that includes at least fasteners, wall anchors, and cable ties. First and second mounting holes are provided, wherein a retainer or wall anchor can be removed from a respective clamping element and used to attach the unit to a selected mounting surface.

19 Claims, 4 Drawing Sheets

(56) References Cited

OTHER PUBLICATIONS

English-language abstract of foreign patent JP 2003-299224A.
Extended European search report for corresponding EP patent application 15174643.5, dated Dec. 9, 2015.
European examination report for corresponding EP patent application 15174643.5, dated Nov. 2, 2016.

* cited by examiner

DEVICE HOUSING WITH FASTENER NESTING PROVISION

FIELD

The application pertains to wall or surface mountable devices. More particularly, the application pertains to devices of a type usable in regional monitoring systems.

BACKGROUND

Devices, such as thermostats, graphical user interfaces, keypads, intercoms, controllers, and security devices, including motion sensors, glassbreak sensors, and smoke or carbon monoxide detectors, are usually mounted on a wall or ceiling surface. Mounting screws are usually provided in a separate package, typically in a sealed plastic bag that ends with trash after installation. The installer will have to open the bag to get screws in hand, pick one to install, and keep the rest in his/her pocket or somewhere that he/she can reach when up on the ladder.

DETAILED DESCRIPTION

Figure 1:
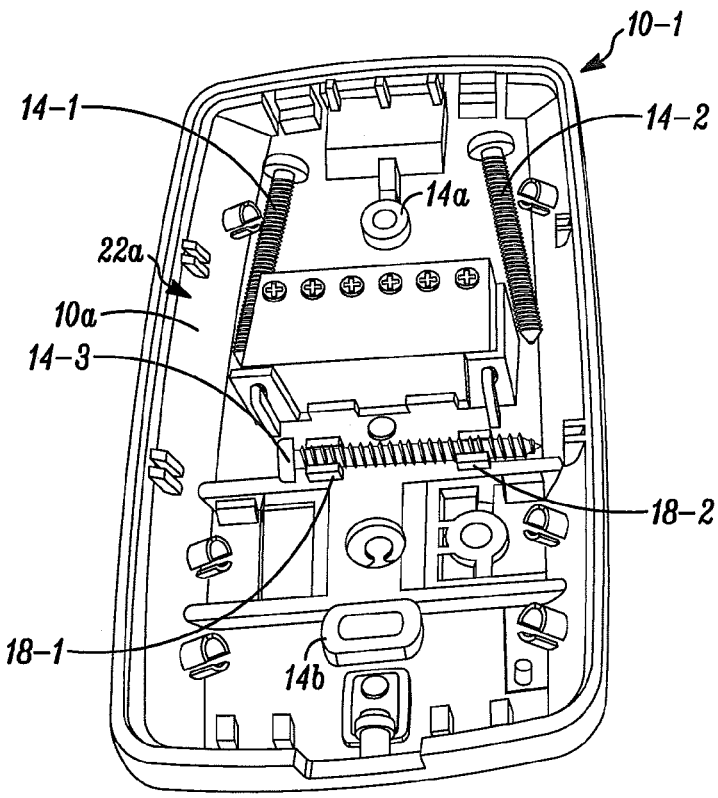
FIG. 1 is a first embodiment of a part of a housing or installation element with fasteners.

While disclosed embodiments can take many different forms, specific embodiments hereof are shown in the drawings and will be described herein in detail with the understanding that the present disclosure is to be considered as an exemplification of the principles hereof as well as the best mode of practicing the same and is not intended to limit the claims hereof to the specific embodiment illustrated.

Fasteners to be used to install electrical units can be removably inserted in a unit's respective housing or mounting plate during the manufacturing process. With this retention feature, all, usually 2 or 3, mounting fasteners are pre-located near the mounting holes of a portion of a housing or mounting bracket. No additional packaging is needed for the fasteners.

The installer does not need to look for or have to worry about where to keep the fasteners that are to be installed. One fastener can be removed to be installed. The rest of the fasteners can remain in the unit being installed. They can be removed individually for installation. This will save mounting time, improve user experience, and reduce waste.

Figure 2:
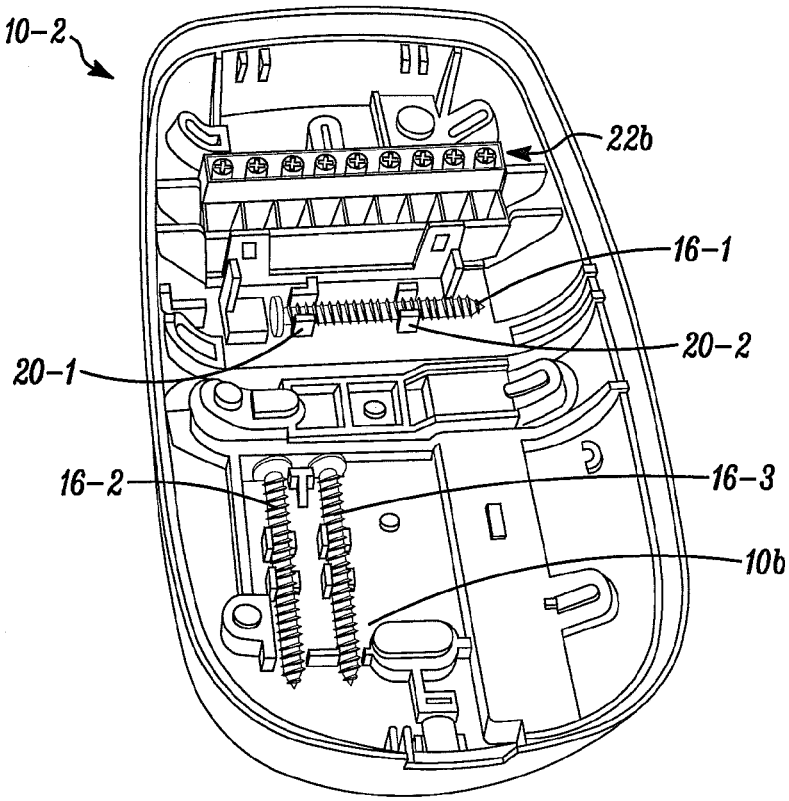
FIG. 2 is a second embodiment of a part of a housing or installation element with fasteners.

With respect to FIGS. 1-3B, several different portions of the housing or mounting plates 10-1, 10-2, and 10-3 are illustrated. All of the elements 10-1, -2, and -3 removably carry fasteners to attach the respective unit to a wall, ceiling, or other mounting surface. FIG. 1 illustrates a configuration 10-1 with three removable fasteners 14-1, -2, -3. FIG. 2 illustrates a configuration 10-2 having a different arrangement of three removable fasteners 16-1, -2, -3.

The above noted fasteners are removably carried by respective pairs, such as 18-1, -2 and 20-1, -2, of yieldable or deformable clamping elements. The elements 18-1, -2, 20-1, -2 are integrally molded as part of the respective unit 10-1, 10-2. Each of the clamping elements has one end attached to a respective surface, such as 10a, 10b. A free second end, as best seen in FIG. 3B, deforms as a respective fastener, such as 14-1 . . . -3 or 16-1 . . . -3, is inserted into the respective clamping element.

In addition to the molded clamping elements 18-1, or 20-1, the housing portions can also carry additional modules, such as a respective connector module 22a, 22b, or 22c, for attachment to communications and/or power lines.

It will be understood that a wide variety of fasteners come within the spirit and scope hereof. These include screws, nails, snap fit elements, or twist lock elements, all without limitation. Those of skill will understand that the exact configuration of the fasteners is not a limitation hereof.

Figure 3A:
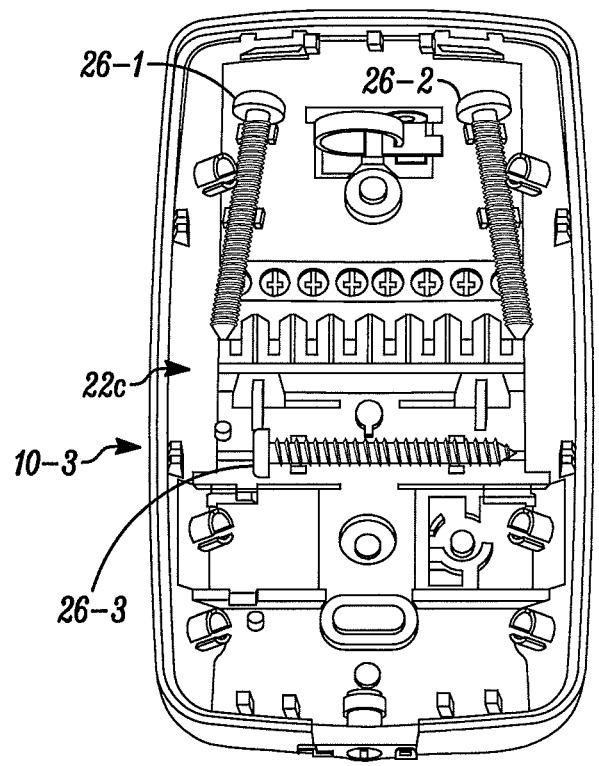
FIG. 3A illustrates an eight conductor embodiment with fasteners.
Figure 3B:
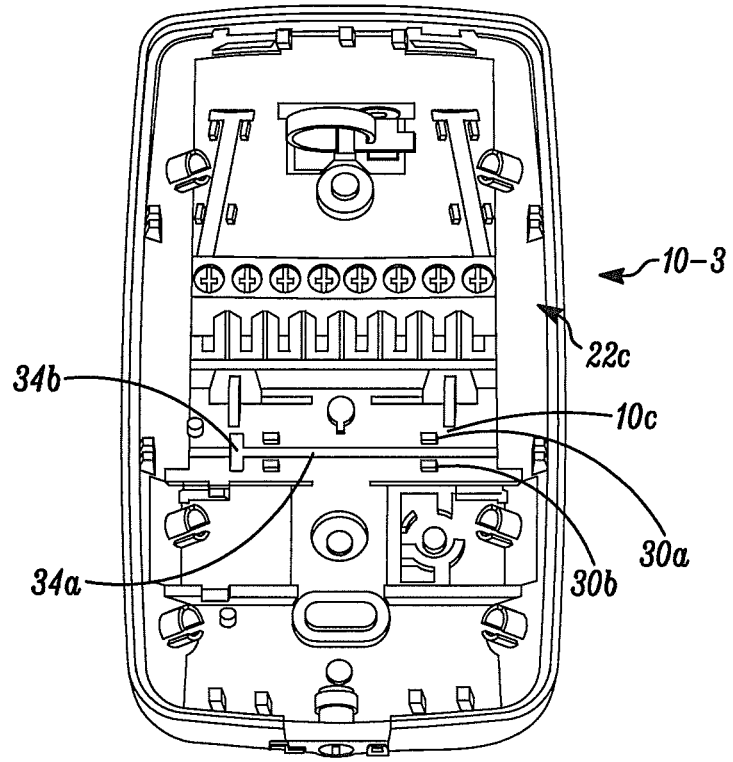
FIG. 3B illustrates the embodiment of FIG. 3A without fasteners.

FIGS. 3A and 3B illustrate different aspects hereof in connection with housing portions or mounting plates, such as 10-3. Pairs of exemplary clamping elements, such as 30a, 30b, integrally formed on a respective interior surface, such as 10c, have one end attached to the surface 10c by the molding process and a second free end that deflects when the respective fastener, such as fasteners 26-1, -2, -3, is inserted between the respective clamping elements.

In another embodiment, optional fastener receiving depressions 34a, 34b can be molded into the surface 10c, best seen in FIG. 3B. Such depressions can improve the grip of the clamping elements 30a, 30b on the respective fastener, such as 26-1, -2 -3.

Thus, as illustrated in the FIGS. 1-3B, fasteners are stored for shipment and for the installer's use on the rear cover portion of the housing or on a respective mounting plate. When mounting the device, the installer just picks up the rear cover, takes a fastener off of it, and then drills or otherwise attaches it to a wall or mounting surface. It saves the time that is required to take fasteners out of a plastic bag and eliminates a need to keep track of them during the mounting process. In summary, the fasteners are conveniently and securely nested in place at the time of manufacture to facilitate the shipping and provisioning of hardware to the installer prior to installation.

Figure 4:
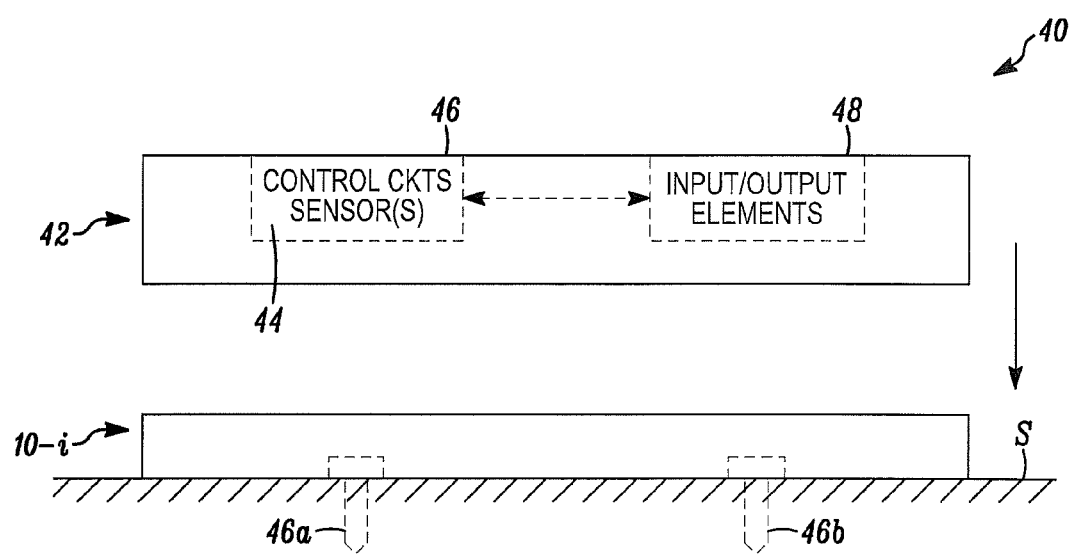
FIG. 4 illustrates an embodiment corresponding to any of the embodiments of FIGS. 1-3B closed with a cover.

FIG. 4 illustrates an electrical unit 40 having a base portion or mounting portion 10-1 as described above, which can releasably carry mounting fasteners 46a, b. The fasteners 46a, b are illustrated attaching the mounting plate portion 10-1 to a surface S. The fasteners 46a, b extend through openings 14a, d in the respective unit, such as the unit 10-1, best seen in FIG. 1.

The unit 40 can be closed with a cover portion 42, which can be attached to the mounting portion 10-1 as would be understood by those of skill in the art. The cover portion can carry one or more sensors 44, control circuits 46, and input output devices 48 as would be understood by those of skill in the art. The units, such as the unit 40, can be in wired, via modules 22i, or wireless communication with displaced monitoring and control panels or units without limitation.

Figure 5:
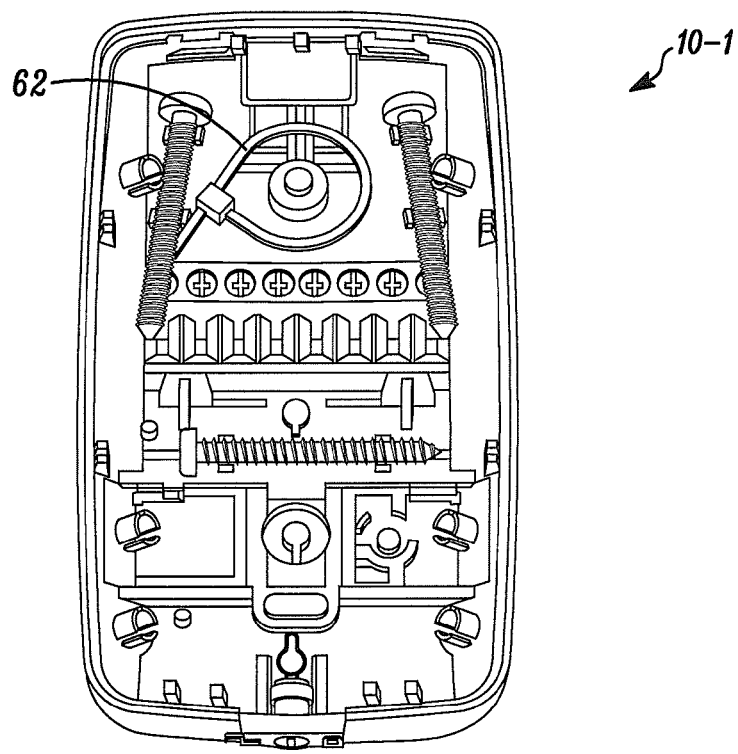
FIG. 5 illustrates another embodiment hereof with a cable tie.
Figure 6:
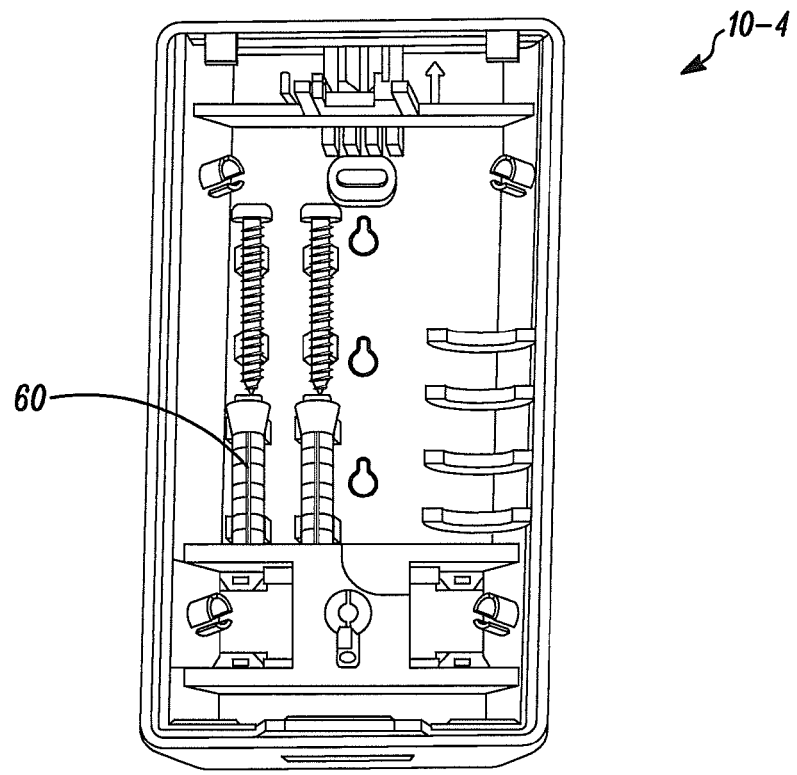
FIG. 6 illustrates yet another embodiment with a wall anchor.

With respect to FIGS. 5, 6, those of skill will understand that instead of or in addition to carrying fasteners, such as 14-1, -2, -3 or 16-1, -2, -3, alternate types of items, including wall anchors 60, cable ties 62, or the like, all of which are useful for field mounting or installation, can be releasably carried by the housing portion or mounting plate, such as 10-1, -2, -3, or -4. All such alternate items come within the spirit and scope hereof.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

The invention claimed is:

1. An apparatus comprising:
a housing comprising a removable item storage location within an internal region of the housing; and
both of a first yieldable receiving post pair and a second yieldable receiving post pair carried in the internal region of the housing for releasably receiving a removable item at the removable item storage location,
wherein the first yieldable receiving post pair and the second yieldable receiving post pair are configured to receive the removable item therebetween,
wherein the first yieldable receiving post pair receives the removable item substantially near a first end of the removable item,
wherein the second yieldable receiving post pair receives the removable item substantially near a second end of the removable item, and
wherein the removable item storage location includes at least one item receiving depression formed on the housing between the first yieldable receiving post pair and the second yieldable receiving post pair.

2. The apparatus as in claim 1 wherein the housing defines a mounting opening therethrough, and wherein the removable item is one selected from a class including at least fasteners, wall anchors, and cable ties.

3. The apparatus as in claim 2 wherein each of the first yieldable receiving post pair and the second yieldable receiving post pairs includes a first item receiving post and a second item receiving post, and wherein the first item receiving post is positioned adjacent the second item receiving post.

4. The apparatus as in claim 3 wherein each of the first item receiving post and the second item receiving posts has one end attached to an interior surface of the housing and an item receiving end extending therefrom.

5. The apparatus as in claim 4 wherein the item receiving end includes a deformable clamping portion.

6. The apparatus as in claim 3 wherein the first item receiving post and the second item receiving post are spaced apart to receive the removable item.

7. The apparatus as in claim 1 wherein the housing defines at least one fastener receiving mounting opening, and wherein a fastener is inserted through the at least one fastener receiving mounting opening to mount the housing on a selected surface.

8. The apparatus as in claim 1 wherein each of the first yieldable receiving post pair and the second yieldable receiving post pair includes at least a first fastener receiving post and a second fastener receiving post.

9. The apparatus as in claim 1 wherein a cover portion is attachable to the housing thereby closing the interior region for including at least one sensor and associated control circuits therein.

10. A device comprising:
a three dimensional member that defines, in part, an interior region, wherein the three dimensional member defines an item storage receiving depression; and
both of a first yieldable receiving post pair and a second yieldable receiving post pair both attached to an internal surface of the three dimensional member for releasably receiving a removable item,
wherein the first yieldable receiving post pair and the second yieldable receiving post pair are configured to receive the removable item therebetween,
wherein the first yieldable receiving post pair receives the removable item substantially near a first end of the removable item,
wherein the second yieldable receiving post pair receives the removable item substantially near a second end of the removable item, and
wherein the item storage receiving depression is formed on the three dimensional member between the first yieldable receiving post pair and the second yieldable receiving post pair.

11. The device as in claim 10 wherein the three dimensional member includes a cover portion.

12. The device as in claim 11 further comprising control circuits to implement a predetermined function.

13. The device as in claim 12 further comprising at least two fastener storing retainers.

14. The device as in claim 13 wherein each of the at least two fastener storing retainers includes a yieldable fastener clamping element.

15. The device as in claim 10 wherein the three dimensional member defines at least one surface mounting opening.

16. An electrical unit comprising:
a mounting portion comprising an interior region;
a first yieldable pair of item clamping elements and a second yieldable pair of item claiming elements extending from the mounting portion for releasably receiving a removable item; and
at least a first mounting hole extending through the mounting portion,
wherein the first yieldable pair of item clamping elements and the second yieldable pair of item clamping elements are configured to receive the removable item therebetween,
wherein the first yieldable pair of item clamping elements receives the removable item substantially near a first end of the removable item,
wherein the second yieldable pair of item clamping elements receives the removable item substantially near a second end of the removable item, and
wherein the mounting portion includes at least one item receiving depression formed on the mounting portion between the first yieldable pair of item clamping elements and the second yieldable pair of item clamping elements.

17. The electrical unit as in claim 16 wherein the removable item is selected from a class including at least fasteners, wall anchors, and cable ties.

18. The electrical unit as in claim 16 wherein the first yieldable pair of item clamping elements and the second yieldable pair of item clamping elements are spaced apart from one another.

19. The electrical unit as in claim 18 further comprising a housing portion attached to the mounting portion.

* * * * *